(12) United States Patent
Mattisson et al.

(10) Patent No.: US 6,259,315 B1
(45) Date of Patent: Jul. 10, 2001

(54) FM DEMODULATOR BEING TUNED TO REFERENCE FREQUENCY BY AUXILIARY DETECTOR

(75) Inventors: Sven Mattisson, Bjärred (SE); Jacobus Haartsen, Borne (NL)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/274,330

(22) Filed: Mar. 23, 1999

(30) Foreign Application Priority Data

Mar. 24, 1998 (GB) .................................................. 9806204

(51) Int. Cl.[7] .................................................. H03D 3/00
(52) U.S. Cl. .......................... 329/318; 329/325; 455/214
(58) Field of Search ................................. 329/325, 326, 329/318, 344; 455/214; 375/324

(56) References Cited

U.S. PATENT DOCUMENTS

| 4,356,567 | 10/1982 | Eguchi et al. | 455/177 |
| 4,426,727 | 1/1984 | Hamada | 381/13 |
| 4,458,207 | 7/1984 | Favreau et al. | 329/136 |
| 5,524,289 | * 6/1996 | Koblitz et al. | 455/182.3 |

FOREIGN PATENT DOCUMENTS

| 2 214 742 | 9/1989 | (GB) . |
| 2 283 871 | 5/1995 | (GB) . |
| WO 95/09480 | 4/1995 | (WO) . |

* cited by examiner

Primary Examiner—Siegfried H. Grimm
(74) Attorney, Agent, or Firm—Burns, Doane, Swecker & Mathis, L.L.P.

(57) ABSTRACT

A demodulator circuit for demodulating a frequency modulated input, which includes a detector (14) that is operable to produce a demodulated signal from an incoming frequency modulated signal. A tuning circuit (19) is connected to the detector and operable to vary the frequency response characteristics of the detector. An auxiliary detector (25, 26) is connected to receive a reference frequency signal and to provide an auxiliary tuning signal to the detector on the basis of detection of the reference frequency signal.

10 Claims, 1 Drawing Sheet

FM DEMODULATOR BEING TUNED TO REFERENCE FREQUENCY BY AUXILIARY DETECTOR

The present invention relates to demodulator circuits for demodulating frequency modulated signals.

DESCRIPTION OF THE RELATED ART

Referring to FIG. 1 of the accompanying drawings, a frequency modulated radio frequency (RF) signal is conventionally received by a receiver 1 from an antenna 2, and processed by the receiver 1 to produce an FM signal at an intermediate frequency which is lower than the RF carrier frequency. The IF modulated signal is then filtered by an IF band pass filter 4 and amplitude limited to a constant amplitude by a hard limiter 5. The constant amplitude signal is then fed to a detector 6 for demodulation by multiplying the signal by its time derivative. This operation makes the product amplitude proportional to the signal's amplitude and angular frequency (intermediate frequency IF plus FM frequency deviation). Since the IF FM signal has a constant amplitude, due to the hard limiter 5, the product signal has an amplitude proportional to the frequency deviation and the modulation signal can easily be recovered after a low-pass filter removes the signal components at multiples of the IF frequency.

Integration of FM detectors into semiconductor devices requires the use of accurate delay elements or filters with well controlled phase characteristics to generate the time-derivative approximation or else excessive DC offsets will occur.

FM demodulators in use today often employ passive resonator components that are trimmed, either at production or by exploiting signal properties. In analogue voice systems the FM-signal is DC free and the integrated output of the FM-detector should equal zero. Any DC value corresponds to a detuning and by proper feedback, the FM detector can be adjusted to minimize the DC component. For TDMA-based digital systems the signal does not have a zero mean but a DC-free preamble may be added to the signal packet and the detector adjusted on this preamble.

Another approach, when the FM-signal frequency (i.e. the last IF) is high compared to the base-band signal, is use of a detector based on a digital delay line as differentiator. This delay line may be clocked by an accurate clock and hence result in a detector with an inherently low DC offset.

A third approach is to use analogue to digital (A/D) conversion of the signal and to perform the FM detection in a digital signal processor (DSP) or other digital circuit.

A digital radio based on a TDMA scheme may use data packets that are not guaranteed to have a zero mean. Also, if the packet preamble is not DC free it will be difficult to use the signal for tuning the FM detector or adjusting its DC offset.

When the radio uses a low IF compared to the symbol rate (for example 3 MHz and 1 Msym/s) or when the modulation index is small the use of a digital delay line may be impractical.

Offsets in the detector circuit elements, especially in multipliers when signal levels are small, may also contribute to the over-all DC offset. Hence, even if the phase characteristics of each building block is properly adjusted the detector may exhibit a non-zero DC offset.

Furthermore, if all DC offset compensation is done by detuning the resonator, the operating point may no longer be symmetrically located on the detector's (S shaped) characteristic and significant signal-pattern dependent offset may appear. That is, because of inter-symbol interference, the detector output amplitude is smallest for alternating ones and zeroes and much larger for contiguous blocks of ones or zeroes. When the detector Q is high, such blocks of ones or zeroes may cause the detector to compress the signal. This compression will be asymmetric if the detector resonator is detuned to compensate DC offsets in other detector blocks resulting in a signal dependent offset.

SUMMARY OF THE PRESENT INVENTION

According to one aspect of the present invention, there is provided a demodulator circuit for demodulating a frequency modulated input signal, the circuit comprising:

detector means which are operable to produce a demodulated signal from an incoming frequency modulated signal;

tuning means connected to the detector means and operable to vary the frequency response characteristics of the detector means; and auxiliary detector means connected to receive a reference frequency signal and to provide an auxiliary tuning signal to said detector means, on the basis of detection of said reference frequency signal.

DETAILED DESCRIPTION OF THE PREFERRED EMBODIMENT

Figure 1:
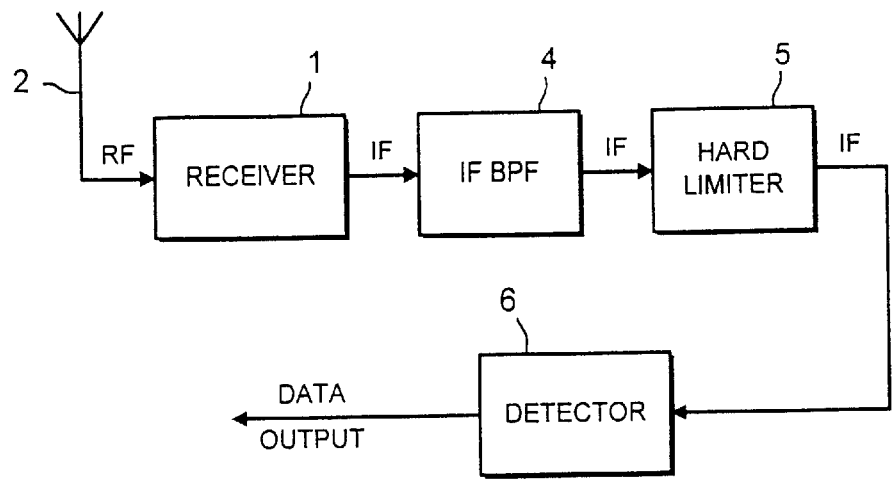
FIG. 1 illustrates a circuit for receiving and demodulating a frequency modulated input signal.
Figure 2:
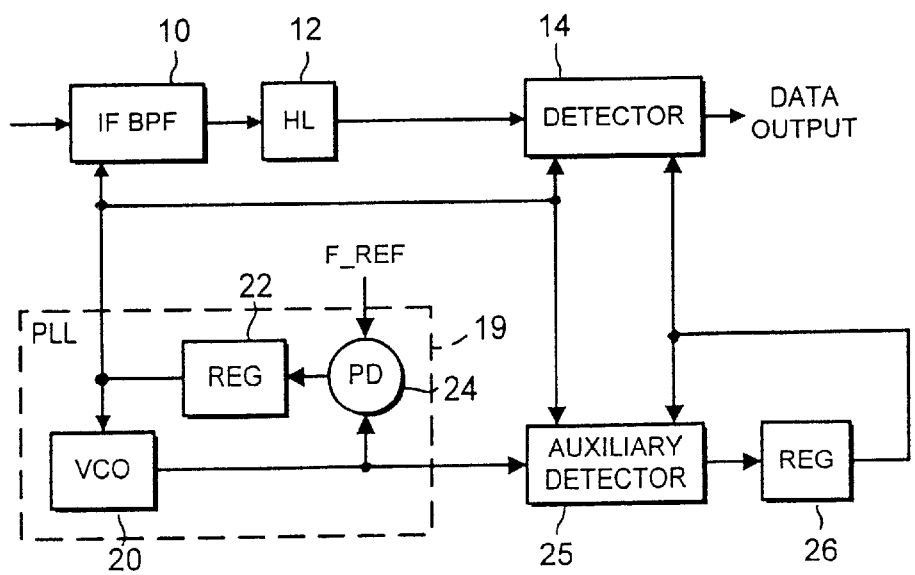
FIG. 2 illustrate a demodulator circuit embodying the present invention.

A demodulator circuit embodying the invention is shown in FIG. 2 and comprises an intermediate frequency bandpass filter 10 (IF BPF) which receives and filters an incoming FM intermediate frequency signal V_IF, in order to remove unwanted noise and harmonic signals. The output of the intermediate filter 10 is connected to the input of a hard limiter 12 (HL) which produces a constant amplitude output signal. This constant amplitude signal is fed to an FM detector 14 which operates broadly in line with the detector described with reference to FIG. 1.

Tuning of the IF strip (IF BPF and detector) is achieved using, for example a phase locked loop (PLL) circuit 19, which includes a voltage controlled oscillator 20 (VCO), a regulator 22, and a phase detector 24. An alternative to the PLL circuit 19 would be to use a frequency locked loop circuit. The PLL circuit 19 operates in conventional manner to produce a output signal V_tune which is dependent upon the phase relationship between the output of the VCO 20 and a reference frequency f_ref. The VCO 20 uses circuitry similar to that used in the filter and detector to enable process variations to be followed. The PLL output voltage V_tune will then reflect process spread (e.g. fast, slow or nominal).

By tuning the IF strip, the detector will be centred at the nominal IF. The adjustment of the components in the detector, however, does not guarantee offset free FM detection. For example a coincidence detector makes use of a multiplier, which can add significant offset to the detected signal.

Any remaining offsets due to detector building block offsets may be reduced by perturbing resonator tuning or by tuning one or more of the building block offsets. In the first case, the offset compensation has to be small or detector asymmetry may add a significant dependent offset. In the second case, offsets can be adjusted by changing block properties such that the offset contributions vary. It is therefore desirable to compenaste for all detector building block offsets.

An auxiliary detector 25 and further regulator 26 are provided. The auxiliary detector 25 receives, as its input, the output from the VCO 20 of the PLL circuit 19. The auxiliary detector 25 also receives the tuning signal V_tune from the PLL 19.

The tuning voltage v_tune is used to make the same tuning adjustments to the auxiliary detector 25 as to the main detector 14.

Since the output of the VCO 20 is unmodulated, the output of the auxiliary detector 25 should be free from DC offset. The auxiliary detector output is received by a regulator 26, and a regulating adjustment signal V_tune_aux is produced in order to compensate for non-resonator induced offsets to maintain the zero DC offset level. The output of the auxiliary regulator 26 is fed to the auxiliary detector 25 and to the detector 14.

Using the auxiliary detector in this way allows the main detector to be automatically tuned to give a zero DC offset response.

Should the VCO be designed to oscillate at another frequency, proper frequency dividers may be inserted at the VCO output or at the reference frequency input to generate the desired frequency. The nominal detector output should then be zero and the regulator 26 may fine tune the master detector to provide zero output.

Embodiments of the present invention offer an FM detector offset compensation method that is compatible with integration and automatic tuning. The FM detector phase characteristic may be adjusted independently of the building-block offset compensation resulting in a more symmetric detector.

If the signal fed to the auxiliary detector is similar in shape to the real signal entering the main detector (i.e. typically the limited IF signal) any signal-dependent non-linear effects will also be compensated for.

If it is desirable to avoid an auxiliary detector reference signal equal to the actual IF frequency scaling may be employed. Then the auxiliary detector would be tuned to a suitable frequency with the resonators scaled accordingly. This scheme will minimize auxiliary detector interference but will be more sensitive to mismatches.

What is claimed is:

1. A demodulator circuit for demodulating a frequency modulated input signal, the circuit comprising:

detector means which are operable to produce a demodulated signal from an incoming frequency modulated signal;

tuning means connected to the detector means and operable to vary the frequency response characteristics of the detector means; and auxiliary detector means continuously connected to receive a reference frequency signal and to provide an auxiliary tuning signal to said detector means, on the basis of detection of said reference frequency signal.

2. A circuit as claimed in claim 1, wherein the tuning means comprises a phase locked loop circuit, which is tuned to the reference frequency signal, the phase locked loop output tuning signal being supplied to the detector means.

3. A circuit as claimed in claim 1, wherein the tuning means comprises a frequency locked loop circuit, which is tuned to the reference frequency signal, the frequency locked loop output tuning signal being supplied to the detector means.

4. A circuit as claimed in claim 1, wherein the tuning means comprises a phase locked loop circuit, which is tuned to a frequency equivalent to a scaled reference frequency signal, the phase locked loop output tuning signal being supplied to the detector means.

5. A circuit as claimed in claim 1, further comprising filter means for receiving a frequency modulated signal and for providing a filtered signal to the detector means, the tuning means being operable to vary the frequency characteristics of the filter means.

6. A demodulator circuit for demodulating a frequency modulated input signal, the circuit comprising:

detector means which are operable to produce a demodulated signal from an incoming frequency modulated signal;

tuning means connected to the detector means and operable to vary the frequency response characteristics of the detector means; and auxiliary detector means continuously connected to receive a reference frequency signal and to continuously provide an auxiliary tuning signal to said detector means.

7. A circuit as claimed in claim 6, wherein the tuning means comprises a phase locked loop circuit, which is tuned to the reference frequency signal, the phase locked loop output tuning signal being supplied to the detector means.

8. A circuit as claimed in claim 6, wherein the tuning means comprises a frequency locked loop circuit, which is tuned to the reference frequency signal, the frequency locked loop output tuning signal being supplied to the detector means.

9. A circuit as claimed in claim 6, wherein the tuning means comprises a phase locked loop circuit, which is tuned to a frequency equivalent to a scaled reference frequency signal, the phase locked loop output tuning signal being supplied to the detector means.

10. A circuit as claimed in claim 6, further comprising filter means for receiving a frequency modulated signal and for providing a filtered signal to the detector means, the tuning means being operable to vary the frequency characteristics of the filter means.

* * * * *